United States Patent
Yang et al.

(10) Patent No.: US 10,582,178 B2
(45) Date of Patent: Mar. 3, 2020

(54) SYSTEMS AND METHODS FOR ACTIVE DEPTH IMAGER WITH BACKGROUND SUBTRACT

(71) Applicant: OmniVision Technologies, Inc., Santa Clara, CA (US)

(72) Inventors: Zheng Yang, San Jose, CA (US); Eiichi Funatsu, San Jose, CA (US); Sohei Manabe, San Jose, CA (US); Keiji Mabuchi, Los Altos, CA (US); Dajiang Yang, San Jose, CA (US); Duli Mao, Sunnyvale, CA (US); Bowei Zhang, Fremont, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/341,374

(22) Filed: Nov. 2, 2016

(65) Prior Publication Data
US 2018/0124372 A1    May 3, 2018

(51) Int. Cl.
*H04N 13/00* (2018.01)
*H04N 13/106* (2018.01)
(Continued)

(52) U.S. Cl.
CPC ........... *H04N 13/106* (2018.05); *G01B 11/24* (2013.01); *G06T 5/001* (2013.01); *G06T 5/50* (2013.01); *G06T 7/586* (2017.01); *G06T 7/593* (2017.01); *H01L 27/146* (2013.01); *H01L 27/14614* (2013.01); *H01L 27/14643* (2013.01); *H04N 5/3535* (2013.01); *H04N 5/378* (2013.01); *H04N 5/37452* (2013.01); *H04N 13/254* (2018.05); *H04N 13/271* (2018.05);
(Continued)

(58) Field of Classification Search
CPC .................. H04N 2103/0081; G06T 7/55
USPC ........................................... 348/47
See application file for complete search history.

(56) References Cited

U.S. PATENT DOCUMENTS

2004/0264761 A1* 12/2004 Mas ................. G06K 9/00664
382/154
2007/0165123 A1    7/2007 Panicacci
(Continued)

OTHER PUBLICATIONS

Konolige et al., A Low-Cost Laser Distance Sensor, IEEE International Conference on Robotics and Automation, 2008, pp. 3002-3008.
(Continued)

*Primary Examiner* — Jeffery A Williams
(74) *Attorney, Agent, or Firm* — Lathrop Gage LLP

(57) ABSTRACT

An active depth imaging system and method of operating the same captures illuminator-on and illuminator-off image data with each of a first and second imager. The illuminator-on image data includes information representing an imaged scene and light emitted from an illuminator and reflected off of objects within the imaged scene. The illuminator-off image data includes information representing the imaged scene without the light emitted from the illuminator. For each image set captured by the first and second imagers, illuminator-off image data is subtracted from the illuminator-on image data to identify the illuminated light within the scene. The depth of an object at which the light is incident on then is determined by the subtracted image data of the first and second imagers.

22 Claims, 12 Drawing Sheets

(51) Int. Cl.
*H01L 27/146* (2006.01)
*H04N 5/3745* (2011.01)
*H04N 13/271* (2018.01)
*G06T 7/586* (2017.01)
*G06T 7/593* (2017.01)
*G01B 11/24* (2006.01)
*H04N 13/254* (2018.01)
*G06T 5/00* (2006.01)
*G06T 5/50* (2006.01)
*H04N 5/353* (2011.01)
*H04N 5/378* (2011.01)

(52) U.S. Cl.
CPC .............. *G06T 2207/10028* (2013.01); *G06T 2207/10144* (2013.01); *G06T 2207/10152* (2013.01); *G06T 2207/20224* (2013.01); *H04N 2013/0092* (2013.01)

(56) References Cited

U.S. PATENT DOCUMENTS

| | | |
|---|---|---|
| 2010/0039217 A1 | 2/2010 | Borlez et al. |
| 2010/0276574 A1 | 11/2010 | Manabe |
| 2012/0038751 A1* | 2/2012 | Yuan .................. H04N 5/23232 348/51 |
| 2012/0274744 A1 | 11/2012 | Wan et al. |
| 2013/0222681 A1 | 8/2013 | Wan |
| 2014/0008520 A1 | 1/2014 | Raynor |
| 2014/0313294 A1* | 10/2014 | Hoffman ............... G06F 3/0425 348/47 |
| 2016/0109575 A1* | 4/2016 | Oggier .................... G01S 17/89 356/5.01 |
| 2016/0125656 A1* | 5/2016 | James ...................... G06T 7/60 345/633 |
| 2016/0344965 A1* | 11/2016 | Grauer .................. H04N 5/353 |

OTHER PUBLICATIONS

Taiwanese Patent Application No. 106136252, Office Action dated Jun. 29, 2018, 10 pp.
Taiwanese Patent Application No. 106136252, English translation of Office Action dated Jun. 29, 2018, 6 pp.
Taiwanese Patent Application No. 106136252, English translation of Office Action dated Mar. 7, 2019, 7 pp.

* cited by examiner

SYSTEMS AND METHODS FOR ACTIVE DEPTH IMAGER WITH BACKGROUND SUBTRACT

BACKGROUND

A stereo camera includes a first imaging array and a second imaging array that capture, respectively, a left image and a right image of a scene from slightly different angles. Depth information can be computed by triangulation of a common feature in the left and right images, so long as the common feature is easily distinguishable in both images. Active stereo cameras, or active depth cameras, ensure a distinguishable common feature by projecting a feature into the cameras' point of view, for example, with a laser projection system.

SUMMARY OF INVENTION

In a first aspect, an active depth imaging system with background subtract includes: an illuminator for emitting a light ray to an object in a scene, where the object reflects the emitted light ray; and a first imager for imaging a first image set of the scene and a second imager for imaging a second image set of the scene. Each of the first and second image sets may include an illuminator-on image data representing the scene when the illuminator is in an on mode, and an illuminator-off image data representing the scene when the illuminator in an off mode. The system may also include an image processor for: generating background-subtracted image data by, for each of the first and second image sets, subtracting the illuminator-off image data from the illuminator-on image data, and analyzing the first and the second background-subtracted image data to determine a depth of the object reflecting the emitted light ray in the scene.

In a second aspect, a method for operating an active depth imaging system includes, for a first time period, configuring each of a first and second imager of the active depth imaging system to capture illuminator-on image data representing an imaged scene and light emitted by an illuminator. The method may also include, for a second time period, configuring each of the first and second imager to not accumulate a charge. The method may also include, for a third time period, configuring each of the first and second imager to capture illuminator-off image data representing the imaged scene without the light. The method may also include, for a fourth time period, configuring each of the first and second imager to not accumulate a charge. The method may also include subtracting, for each of the respective first and second imagers, the illuminator-off image data from the illuminator-on image data to identify the light emitted by the illuminator within the scene. The method may also include identifying depth information of an object within the imaged scene at which the light is incident on.

DETAILED DESCRIPTION OF THE EMBODIMENTS

A stereo camera captures a left image and a right image of a scene from slightly different angles. Depth information can be computed by triangulation of a common feature in the left and right images. The common feature may be generated by projecting a bright spot, e.g., laser spot, by an illuminator, e.g., laser. However, the laser spot may not be well visible under bright sunlight.

Figure 1:
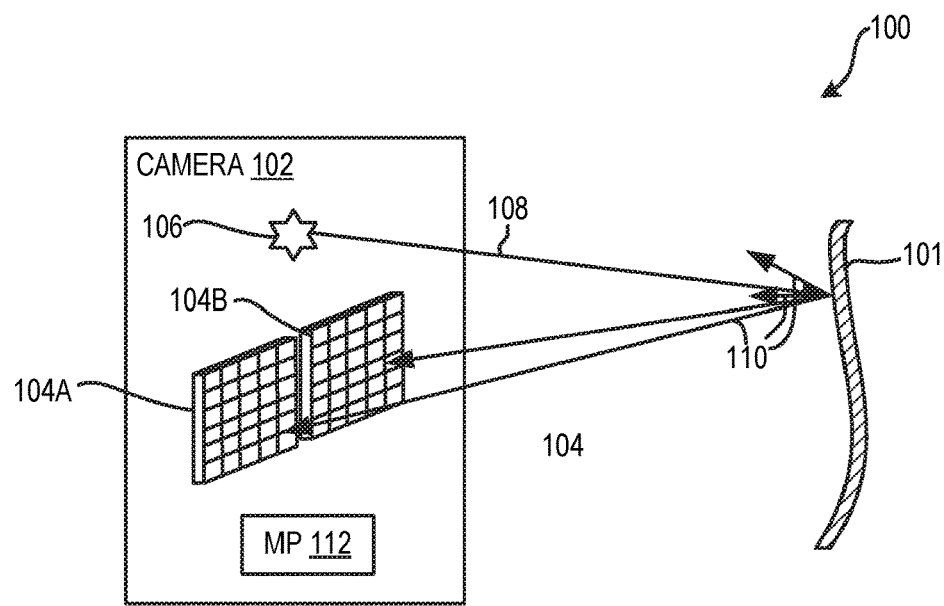
FIG. 1 depicts an active depth system for capturing depth information using a laser projection.

FIG. 1 depicts an active depth system 100 for capturing depth information using a laser projection, in embodiments. System 100 includes a stereo camera 102 for imaging a 3D scene 101. Stereo camera 102 includes a left imaging array 104A and a right imaging array 104B, and an illuminator 106 such as a laser. Two imaging lenses or a single lens for forming images on left imaging array 104A and right imaging array 104B, respectively, are omitted from FIG. 1. To capture depth information of the scene 101, illuminator 106 illuminates the scene with light rays 108. Reflected light 110 that reflects off of objects within scene 101 is then transmitted back to arrays 104A and 104B. Referring to reflected light 110, images captured by left imaging array 104A and right imaging array 104B are computed by triangulation to determine depth of object that reflects off reflected light 110 within scene 101.

Figure 2:
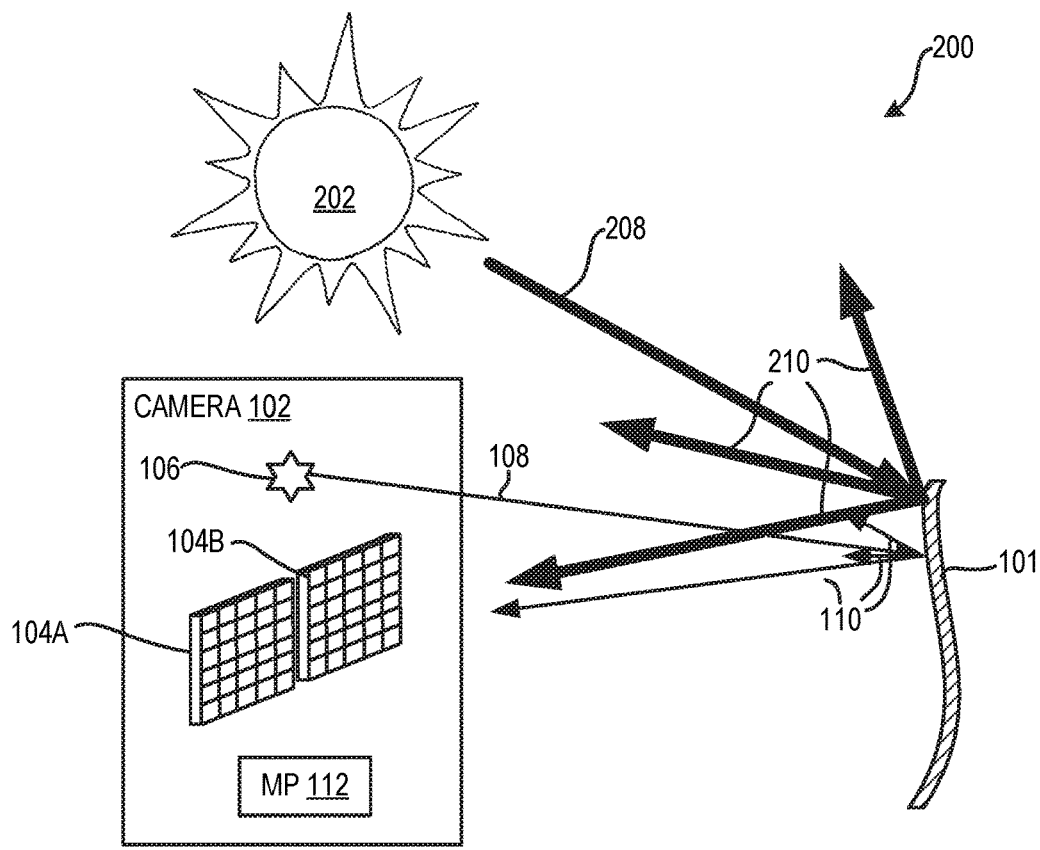
FIG. 2 depicts a scenario 200 of use of the active depth system 100, of FIG. 1.

FIG. 2 depicts a scenario 200 of use of the active depth system 100, of FIG. 1. In the scenario 200 of FIG. 2, a bright light source 202, such as the sun or other bright light source illuminating the imaged scene, emits bright light rays 208 that also reflect off of the objects within scene 101. However, because light rays 208 from bright light source 202 have significantly greater intensity than illuminated light rays 108 from illuminator 106, the bright light source 202 results in such that the reflected light 110 is drowned out by reflected bright light 210. The discussion and embodiments of the active depth system 100 counteract the bright light source 202 such that illuminated light rays 108 may be properly analyzed.

The embodiments disclosed herein solve the disadvantages of prior art active depth cameras by improving the ability to reject information from bright light sources, such as the sun. Sunlight can saturate the imager and thereby wash out the projected pattern by the illuminator within the active depth camera system. One way to prevent this saturation is to reduce the exposure time of the pixel array within the camera. However, doing so reduces the sensitivity of the camera system to the illuminated signal by the illuminator (e.g., laser spot).

Furthermore, ambient or reflected light from a bright light source can decrease contrast between the projected feature and background, and require higher laser power to maintain a distinguishable projected feature. On the other hand, it is necessary to maintain sufficiently low power to prevent eye damage and thermal damage to the laser.

A pulsed laser with sufficiently high repetition rate can achieve these constraints. At low laser pulse repetition rates, e.g., less than 200 kHz, the damage threshold of the human eye depends on the laser's peak power. At higher repetition rates, the damage threshold depends on the laser's average power. Hence, at higher repetition rates, the laser's peak power can be increased while proportionally decreasing its duty cycle to maintain an average power below the eye damage threshold. A pulsed laser having a peak power higher than ambient light may be used with synchronized shutter to enhance the projected light.

The shutter may be synchronized with the laser pulse. When a laser pulse is emitted, the electronic shutter is open and the image is captured, when the laser pulse is no longer emitted, the electronic shutter is closed and the image is no longer captured. In this manner, only images containing laser pulse will be captured, and images without laser pulse will not be captured. Since the laser pulse is short, the shutter time is accordingly short. However, although the shutter time is short, the sunlight is captured as well when the shutter is open. To further enhance the visibility of the projected laser spot, a background (image containing no laser pulse) is subtracted from the image containing laser pulse.

Figure 3:
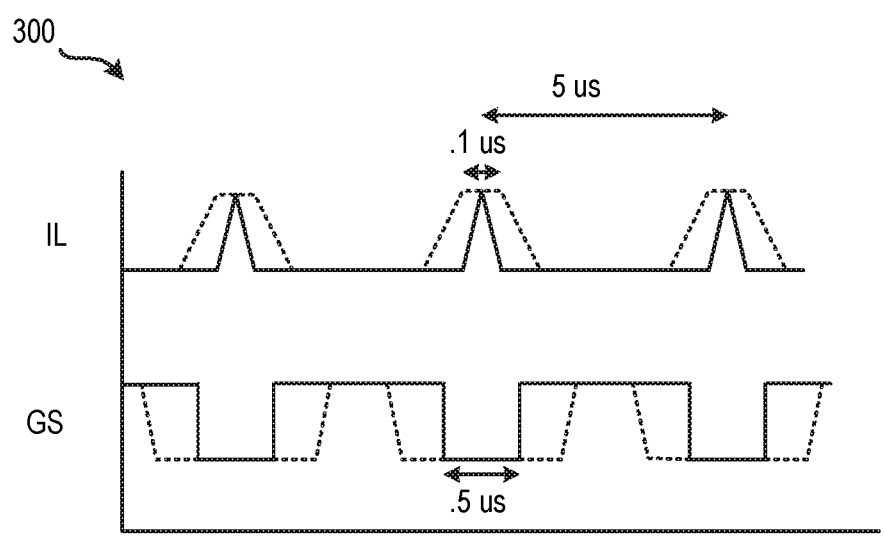
FIG. 3 depicts an exemplary timing diagram 300 showing comparisons between IL (illumination) and GS (global shutter) signals discussed herein.

FIG. 3 depicts an exemplary timing diagram 300 showing comparisons between IL (illumination) and GS (global shutter) signals discussed herein. IL signal controls laser pulse, when IL signal is high, a laser pulse is emitted. GS signal controls electronic shutter, when GS signal is low, electronic shutter is open and an image is captured. For example, the camera operates to collect data of the emitted laser pulse, and then light reflected off objects within the field of view, and then captured by an imager. For example, a laser in FIG. 3 is shown illuminating for 0.1 μs. For this 0.1 μs illuminator duration, for example, GS signal activates the imager for 0.5 μs. Two consecutive laser pulses may be separated by 5 μs. For comparison, a normal frame may be 33 ms (30 frame-per-second). However, IL signal may activate the laser or illuminator for longer or shorter durations, and GS signal may activate the imager for longer or shorter durations. Thus, in certain embodiments, the ratio of the illuminator signal IL activation duration to the global shutter signal GS activation duration is optimized to reduce the amount of background light, other than light emitted by the laser or illuminator, captured and stored within the imager. In the example, to capture 0.1 μs laser pulse, the shutter is opened for 0.5 μs. Accordingly, to distinguish the laser pulse in the captured image, the intensity of the laser pulse must be 5× of that of the background light. However, as will be described in more detailed later, by subtracting the background light from the captured image containing laser pulse, the intensity of the laser pulse does not have to be as high as 5× of the intensity of the background light.

Figure 4:
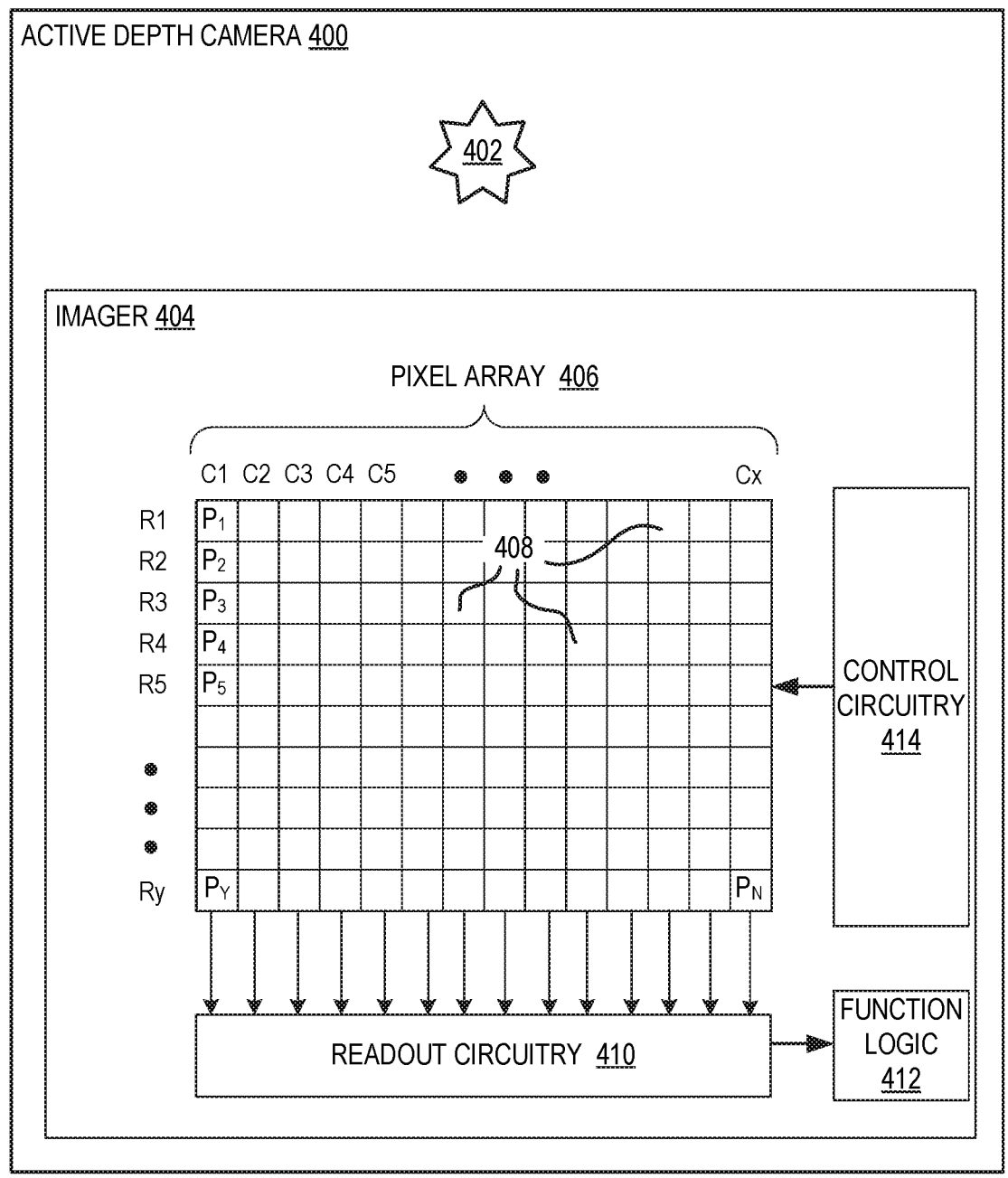
FIG. 4 depicts an exemplary active depth camera including an illuminator, and an imager, in embodiments.

FIG. 4 depicts an exemplary active depth camera 400 including an illuminator 402, and an imager 404, in one embodiment. Active depth camera 400 is an example of active depth camera 100 and includes a left imager and a right imager (similar to imagers 104A, 104B). However, only one imager (imager 404) is shown in FIG. 4 and discussed herein for simplicity, since both imagers are identical. Illuminator 402 may be a laser projection system that emits IR light having a wavelength between 800 and 1000 nm or visible light. In certain embodiments, illuminator 402 emits 850 nm wavelength light or 940 nm wavelength light. However, illuminator 402 may emit light having any wavelengths that can be detected by imager 404. Emitted light from illuminator 402 reflects off of objects within a field of view of the imager 404 and is captured by imager 404 as a lens (not shown) forms an image on imager 404.

Each imager 404 includes a pixel array 406 including a 2-dimensional array of pixels 408 ($P_1$, $P_2$, ... $P_N$). Each pixel 408 may be a complementary-metal-oxide semiconductor (CMOS) pixel, a charge-coupled device (CCD) pixel, or other pixel type. As shown, each pixel is arranged into a row (R1, R2, ... $R_Y$) and a column (C1, C2, ... $C_X$) to acquire an image of a scene in the field of view of imager 404. Image data of the acquired image may be 2 dimensional or 3 dimensional.

Each pixel 408 is a lock-in dual storage gate pixel capable of storing charge from multiple exposures on a single pixel, as discussed in further detail below. After each pixel has acquired its image data, the image data is read out by readout circuitry 410 and transferred to function logic 412. Function logic 412 processes said image data to apply post image effects (e.g. crop, rotate, remove red eye, adjust brightness, adjust contrast, determine depth information, or otherwise). For example, function logic 412 may process the image data such that imager 404 may be utilized in conjunction with illuminator 402 to determine the depth information of the object that reflects off the emitted light from illuminator 402. For example, the depth information is determined (e.g. within function logic 412) from a left imager and a right imager based on triangulation (again, only one imager 404 is shown in FIG. 4 for simplicity). Such processing may allow for the camera 400 to provide depth information of objects within the field of view of the imager 404. The depth calculation is performed after a background subtraction. The depth calculation may be based on triangulation or other methods.

Imager 404 may further include control circuitry 414 coupled with array 406 for generating various signals to control operation of each pixel 408.

Figure 5:
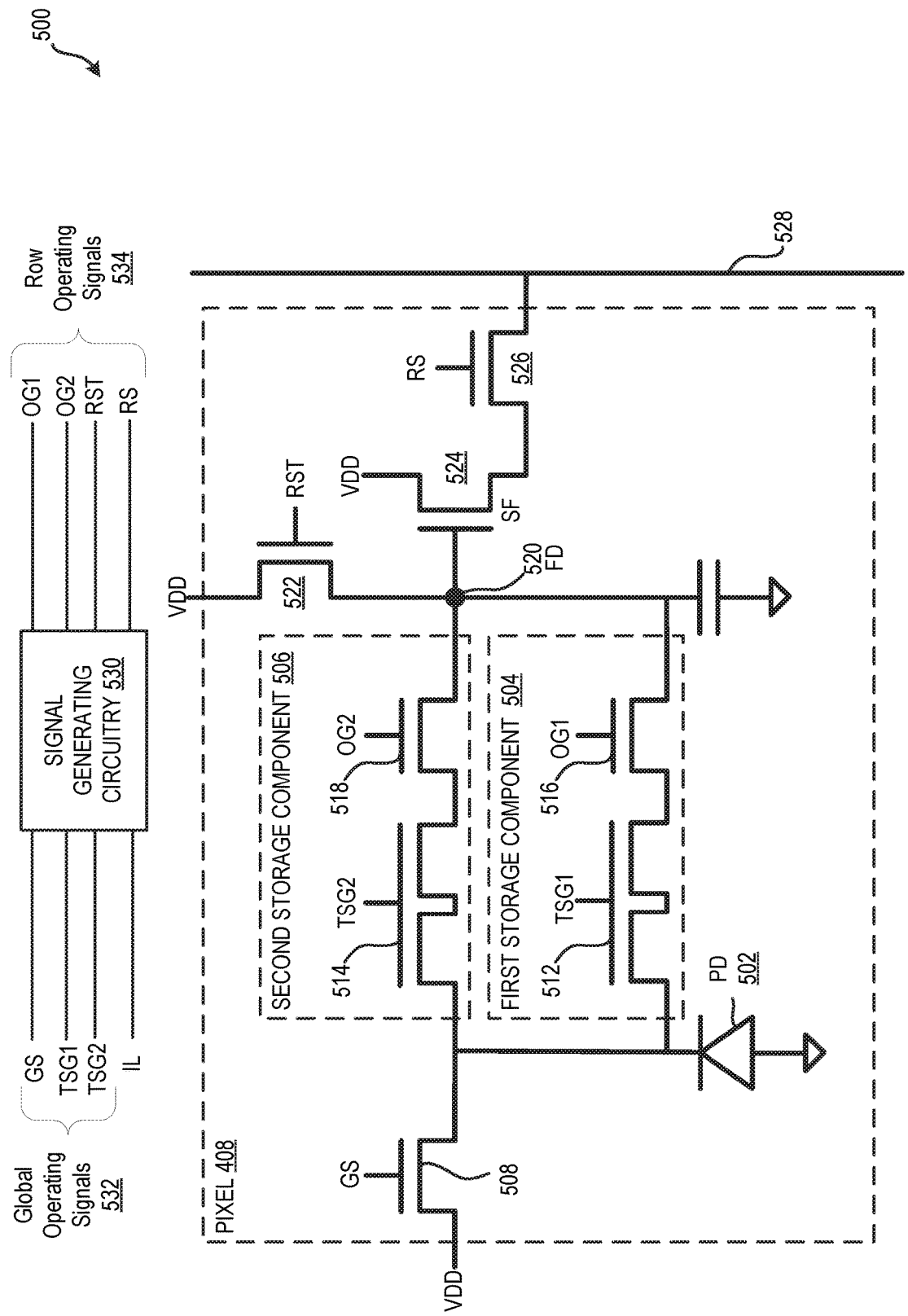
FIG. 5 depicts an exemplary lock-in dual storage gate global shutter pixel circuit for storing both illuminator-on and illuminator-off image data, in one embodiment.

FIG. 5 depicts an exemplary lock-in dual storage gate global shutter pixel circuit 500 for storing both illuminator-on and illuminator-off image data, in one embodiment. Pixel circuit 500 is adapted for use within active depth imaging camera 400, of FIG. 4. It should be appreciated that pixel circuit 500 may be used within a 2D (one imager) or 3D (two imagers) imaging system, such as a CCD, CMOS, MOS, or other type of imaging device. Circuit 500 depicts a single one of pixels 408, however, it should be appreciated that circuit 500 includes a plurality of additional pixels (not shown) forming the pixel array 406, of FIG. 4.

Pixel 408 includes a photodiode 502 coupled to first and second storage components 504, 506, respectively. Photodiode 502 converts incident light that impinges thereon to an electronic charge. Pixel 408 includes a global shutter 508 for controlling when photodiode 502 is active and thus accumulating charge. Global shutter switch 508 may be implemented as a switching device that controls when the photodiode is active in response to a global shutter signal GS. For example, each pixel 408 or a group of pixels may have a dedicated global shutter switch.

First storage component 504 and second storage component 506 each respectively includes a transfer-storage gate 512, 514 and an output gate 516, 518. Transfer-storage gates 512, 514 are illustrated as merged transfer storage gates similar to those described in U.S. Patent Publication No. 2014/00633041, entitled "Image Sensor with Fixed Potential Output Transistor," filed Aug. 30, 2012 and which is incorporated by reference herein in its entirety. Transfer-storage gate 512 is controlled by first transfer-storage gate signal TSG1. Transfer-storage gate 514 is controlled by a second transfer-storage gate signal TSG2. Enabling TSG1 causes transfer-storage gate 512 to transfer-and store accumulated charge within photodiode 502. Enabling TSG2 causes transfer-storage gate 514 to transfer-and store accumulated charge within photodiode 502. It should be appreciated that although illustrated using a merged transfer-storage gate, each of first and second storage components 504, 506 may be implemented with separate transfer gates and storage gates instead of merged transfer-storage gates. In certain embodiments, image data captured by transfer-storage gates 512 and 514 may be analyzed to subtract the background information (i.e. the image data stored within second transfer-storage gate 514) from that of the image data including the background and illuminating light from illuminator 402 (i.e. the image data stored within first transfer-storage gate 512).

Circuitry 500 further includes signal generation circuitry 530 for generating global operating signals 532, including for example GS, TSG1, TSG2, and IL, as well as row specific operating signals 534, including for example OG1, OG2, RST, and RS. Signal generation circuitry 530 is an example of control circuitry 414 of FIG. 4. Global operating signals 532 control each pixel 408 within the array 406 at the same time. Alternatively, global operating signals 532 may control a subset of the array 406 at a given time period, and additional global operating signals may control the remaining subset(s) during an additional time period. Row specific operating signals 534 control readout of each pixel 408 after charge integration and storage. Signal generating circuitry 530 may be processor or microprocessor based, or alternatively may be one or more discrete circuit module(s) for generating said operating signals. Signal generating circuitry 530 may be included in imager 404.

In one embodiment charge collected by photodiode 502 is integrated and stored according to the following. For a first time period, signal generating circuitry 530 generates a global shutter signal GS to activate global shutter switch 508 such that photodiode 502 accumulates charge. The first time period may be synchronized with an illumination signal IL for controlling illuminator (i.e. illuminator 402). During this first time period, signal generating circuitry 530 also generates signal TSG1 such that the charge accumulated in the photodiode during the first time period is transferred and stored within transfer-storage gate 512.

Then, during a second time period, signal generating circuitry 530 configures the global shutter signal GS such that charge is not accumulated in photodiode 502, and therefore photodiode 502 is reset.

During a third time period, signal generating circuitry 530 configures the global shutter signal GS such that photodiode 502 again accumulates charge. During third time period, however, the accumulated charge is representative of the imaged scene without illumination by illuminator (i.e. illuminator 402). During this third time period, signal generating circuitry 530 also generates signal TSG2 such that the charge accumulated in the photodiode during the third time period is transferred and stored within transfer-storage gate 514.

Then, during a fourth time period, signal generating circuitry 530 configures the global shutter signal GS such that charge is not accumulated in photodiode 502, and therefore photodiode 502 is reset.

Figure 6:
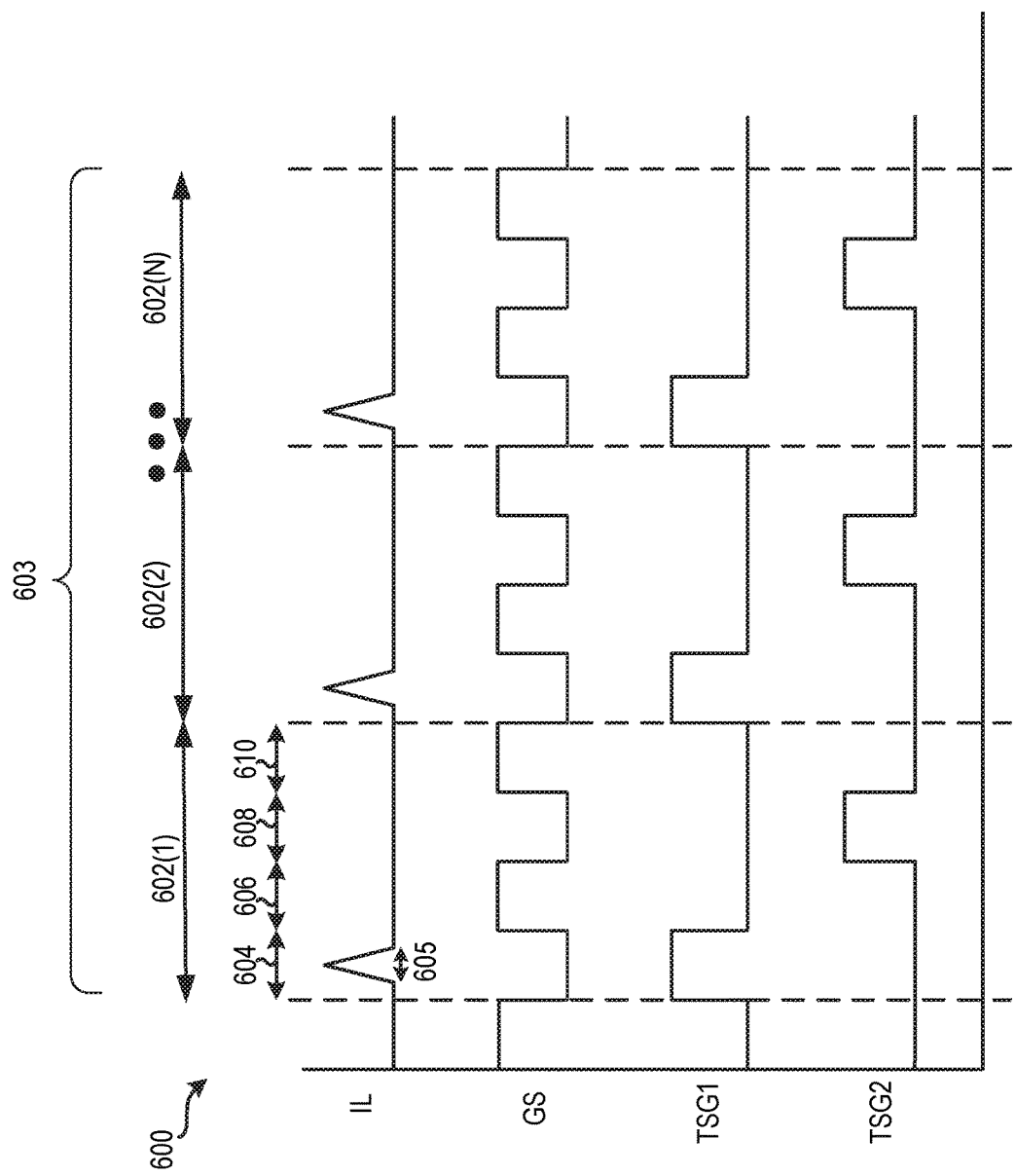
FIG. 6 depicts an exemplary timing diagram showing each of global operating signals (GS, TSG1, TSG2) and illumination signal IL, in a one embodiment.

FIG. 6 depicts an exemplary timing diagram 600 showing each of global operating signals 532 (GS, TSG1, TSG2) and illumination signal IL, in a one embodiment. Timing diagram 600 depicts a plurality of exposure cycles (602(1), 602(2), . . . 602(N)) that form an image frame 603. It should be appreciated that there could be any number of exposure cycles without departing from the scope hereof.

An exposure cycle 602(1) includes a first time period 604. First time period 604 operates as a first transfer-storage gate storage time period that stores image information including light from illuminator 402. During first time period 604, illuminator signal IL is configured high such that illuminator (i.e. illuminator 402) illuminates the field of view of the photo array (i.e. photo array 406). Also during first time period 604, global shutter signal GS is set low such that photodiode 502 may accumulate charge. Accordingly, photodiode 502 accumulates charge representing image data of the field of view including light emitted by illuminator 402 that is reflected off of objects within the field of view of the photodiode. Also during first time period 604, TSG1 is configured high such that accumulated charge within photodiode 502 is stored within first transfer-storage gate 512. Also, TSG2 is set low to configure second transfer-storage gate 512 such that it does not store charge from photodiode 502. The duration of first time period 604 may be greater than the time duration 605 of illumination signal IL. Moreover, the duration of time period 604 may be configured such that the light emitted by illuminator 402 has enough time to reach objects within the field of view and reflect back and be sensed by photodiode 502.

Next, in second time period 606, illuminator signal IL is set low such that illuminator 402 is turned off. Global shutter signal GS is set high such that charge is not accumulated in photodiode 502, and photodiode 502 is reset. TSG1 is set low to configure first transfer-storage gate 512 such that it does not store charge from photodiode 502. Also, TSG2 is set low to configure second transfer-storage gate 514 such that it does not store charge from photodiode 502.

Next, in third time period 608, illuminator signal IL remains set low such that illuminator 402 is turned off. Global shutter signal GS is set low to configure photodiode 502 such that charge is accumulated in photodiode 502. TSG1 is set low to configure first transfer-storage gate 512 such that it does not store charge from photodiode 502. TSG2 is set high to configure second transfer-storage gate 514 such that it stores charge from photodiode 502. Because illuminator signal IL is set low, the charge stored in second transfer-storage gate 514 during third time period 608 is representative of the field of view of the photodiode 502 without any reflected light emitted by illuminator 402.

Next, in fourth time period 610, illuminator signal IL remains set low such that illuminator 402 is turned off. Global shutter signal GS is set high such that charge is not accumulated in photodiode 502, and photodiode 502 is reset. TSG1 is set low to configure first transfer-storage gate 512 such that it does not store charge from photodiode 502. Also, TSG2 is set low to configure second transfer-storage gate 514 such that it does not store charge from photodiode 502. Fourth time period 610 is similar to second time period 606.

In timing diagram 600, the ratio of durations of first time period 604, second time period 606, third time period 608 and fourth time period 610 is 1:1:1:1. In other words, each of first, second, third, and fourth time period has the same duration. It is appreciated that the ratio of durations of first time period 604, second time period 606, third time period 608 and fourth time period 610 may be any combination.

A next exposure cycle 602(2) repeats the process of the exposure cycle 602(1). The first accumulated charge within photodiode 502 (illumination-on) in the exposure cycle 602(2) is transferred to first transfer-storage gate 512 and is added to the first accumulated charge within photodiode 502 during time period 604 (illumination-on) in the exposure cycle 602(1) which is already stored within first transfer-storage gate 512. Then the second accumulated charge within photodiode 502 (illumination-off) in the exposure cycle 602(2) is transferred to second transfer-storage gate 514 and is added to the second accumulated charge within photodiode 502 during time period 608 (illumination-off) in the exposure cycle 602(1) which is already stored within second transfer-storage gate 514.

The same process is repeated until an exposure cycle 602(N). In this manner, first transfer-storage gate 512 accumulates all charges accumulated within photodiode 502 when TSG1 is set high (illumination-on), from exposure cycle 602(1) to exposure cycle 602(N). Similarly, second transfer-storage gate 514 accumulates all charges accumulated within photodiode 502 when TSG2 is set high (illumination-off), from exposure cycle 602(1) to exposure cycle 602(N).

Lastly, after exposure cycle 602(N), the frame 603 ends with a readout time period such that charges accumulated and stored within each pair of first transfer-storage gate 512, and second transfer-storage gate 514 are readout and may be subtracted. The image data information is read only once per N exposure cycles.

Figure 7:
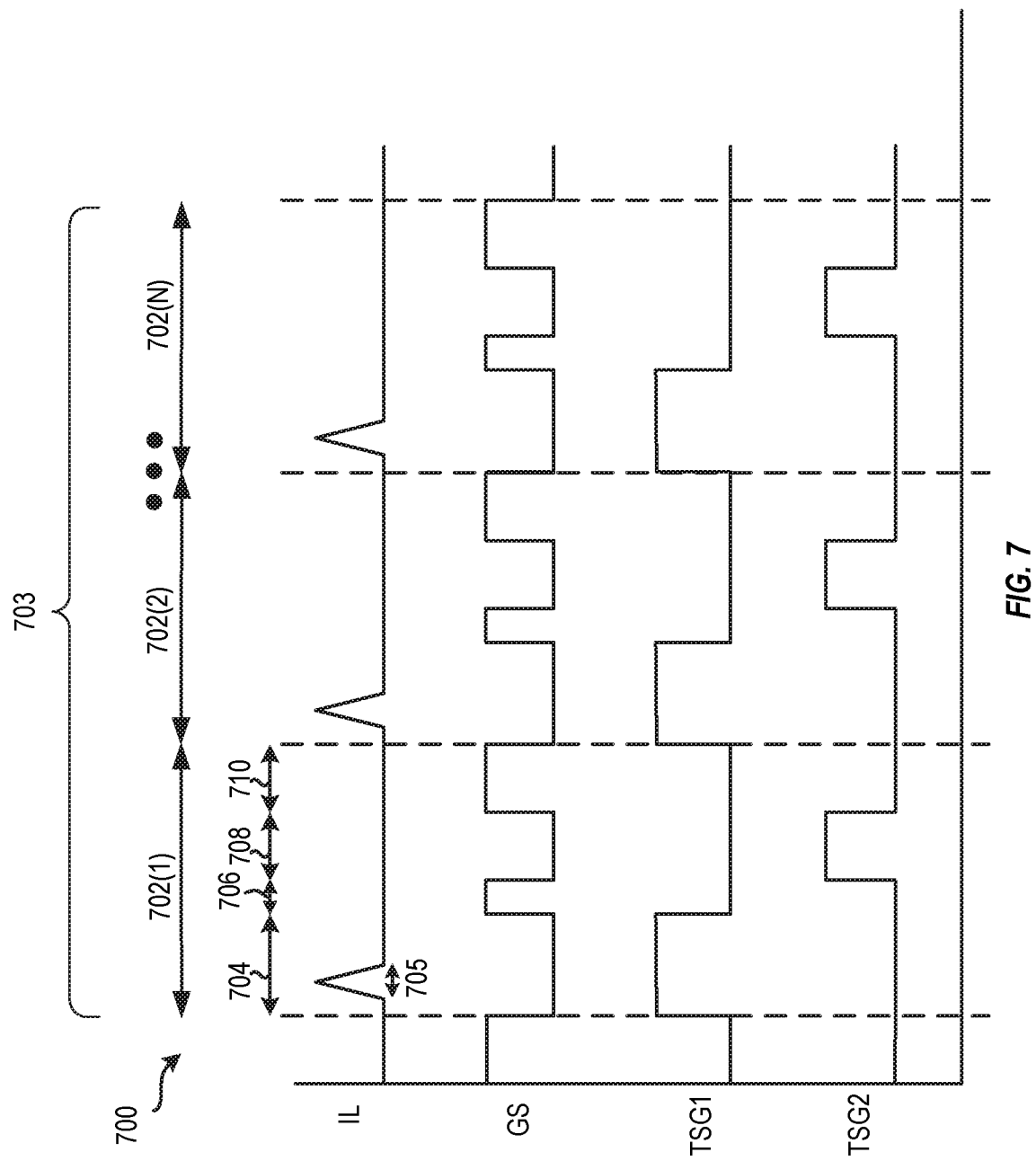
FIG. 7 depicts an exemplary timing diagram showing each of global operating signals (GS, TSG1, TSG2) and illumination signal IL, in another embodiment.

FIG. 7 depicts an exemplary timing diagram 700 showing each of global operating signals 532 (GS, TSG1, TSG2) and illumination signal IL, in another embodiment. FIG. 7 is similar to FIG. 6, except in timing diagram 700, the ratio of durations of first time period 704, second time period 706, third time period 708 and fourth time period 710 is first time period 704>third time period 708=fourth time period 710>second time period 706.

Figure 8:
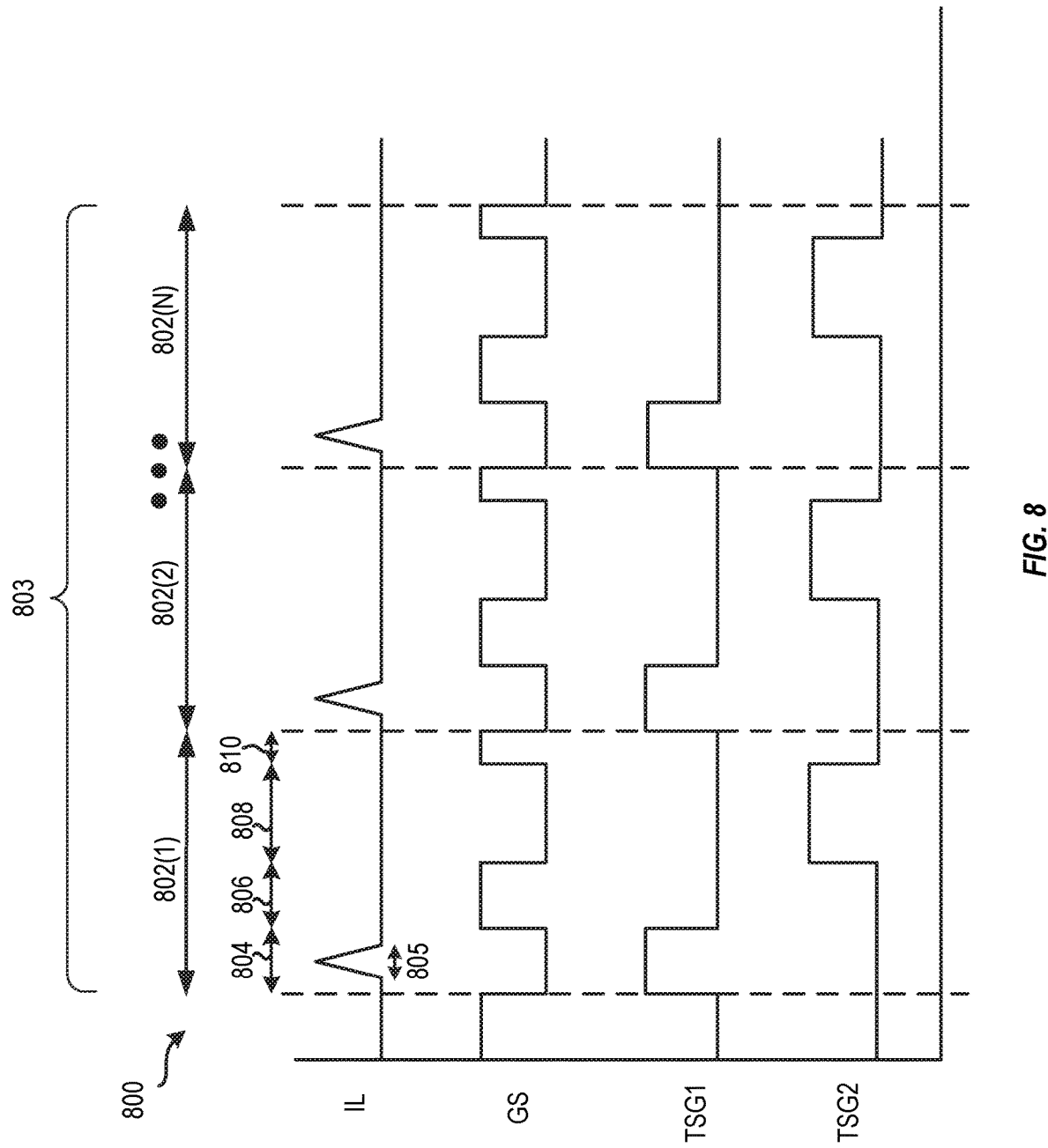
FIG. 8 depicts an exemplary timing diagram showing each of global operating signals (GS, TSG1, TSG2) and illumination signal IL, in another embodiment.

FIG. 8 depicts an exemplary timing diagram 800 showing each of global operating signals 532 (GS, TSG1, TSG2) and illumination signal IL, in another embodiment. FIG. 8 is similar to FIG. 6, except in timing diagram 800, the ratio of durations of first time period 804, second time period 806, third time period 808 and fourth time period 810 is: third time period 808>first time period 804=second time period 806>fourth time period 810.

Figure 9:
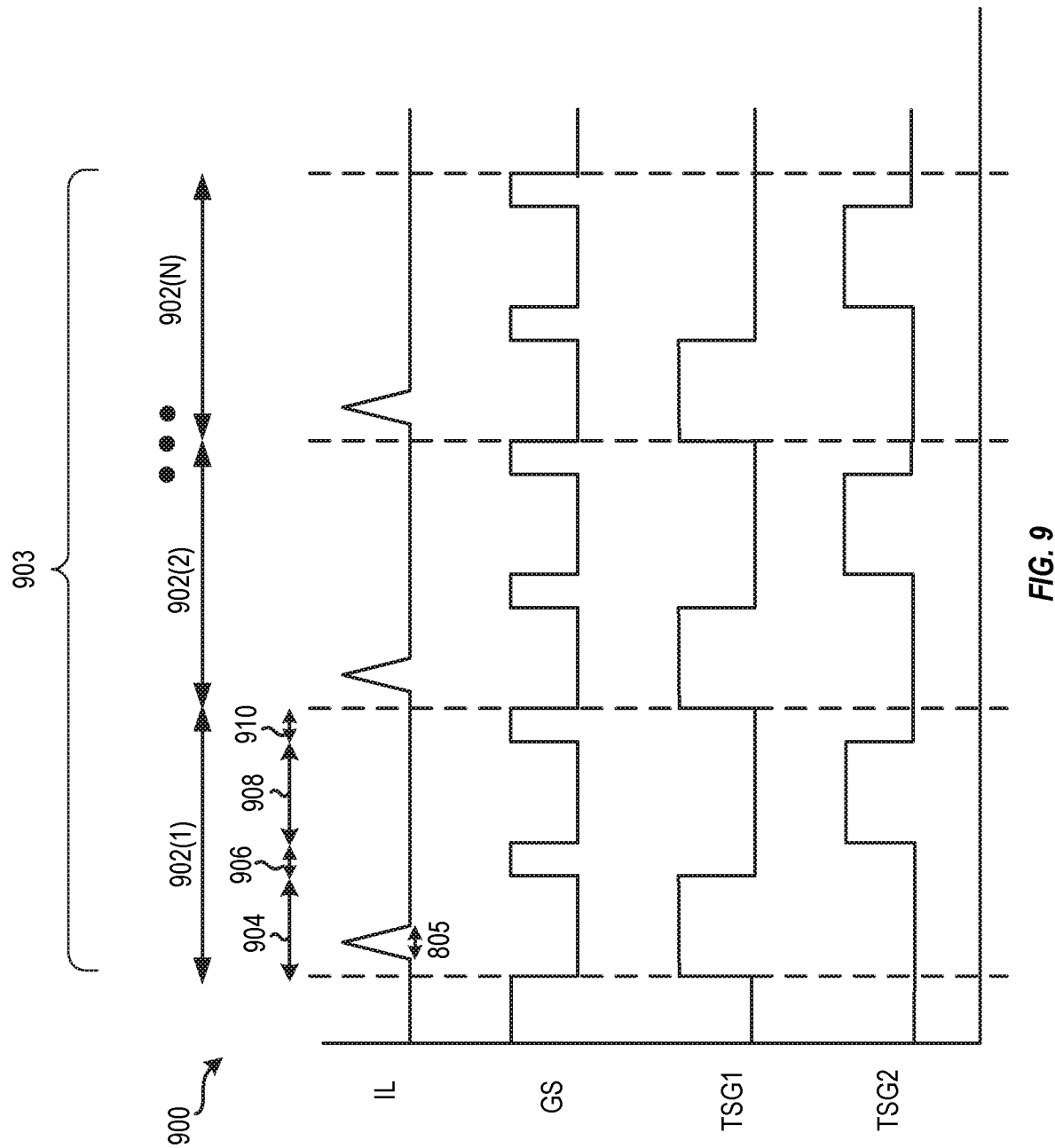
FIG. 9 depicts an exemplary timing diagram showing each of global operating signals (GS, TSG1, TSG2) and illumination signal IL, in another embodiment.

FIG. 9 depicts an exemplary timing diagram 900 showing each of global operating signals 532 (GS, TSG1, TSG2) and illumination signal IL, in another embodiment. FIG. 9 is similar to FIG. 6, except in timing diagram 900, the ratio of durations of first time period 904, second time period 906, third time period 908 and fourth time period 910 is: first time period 904=third time period 908>second time period 906=fourth time period 910.

Figure 10:
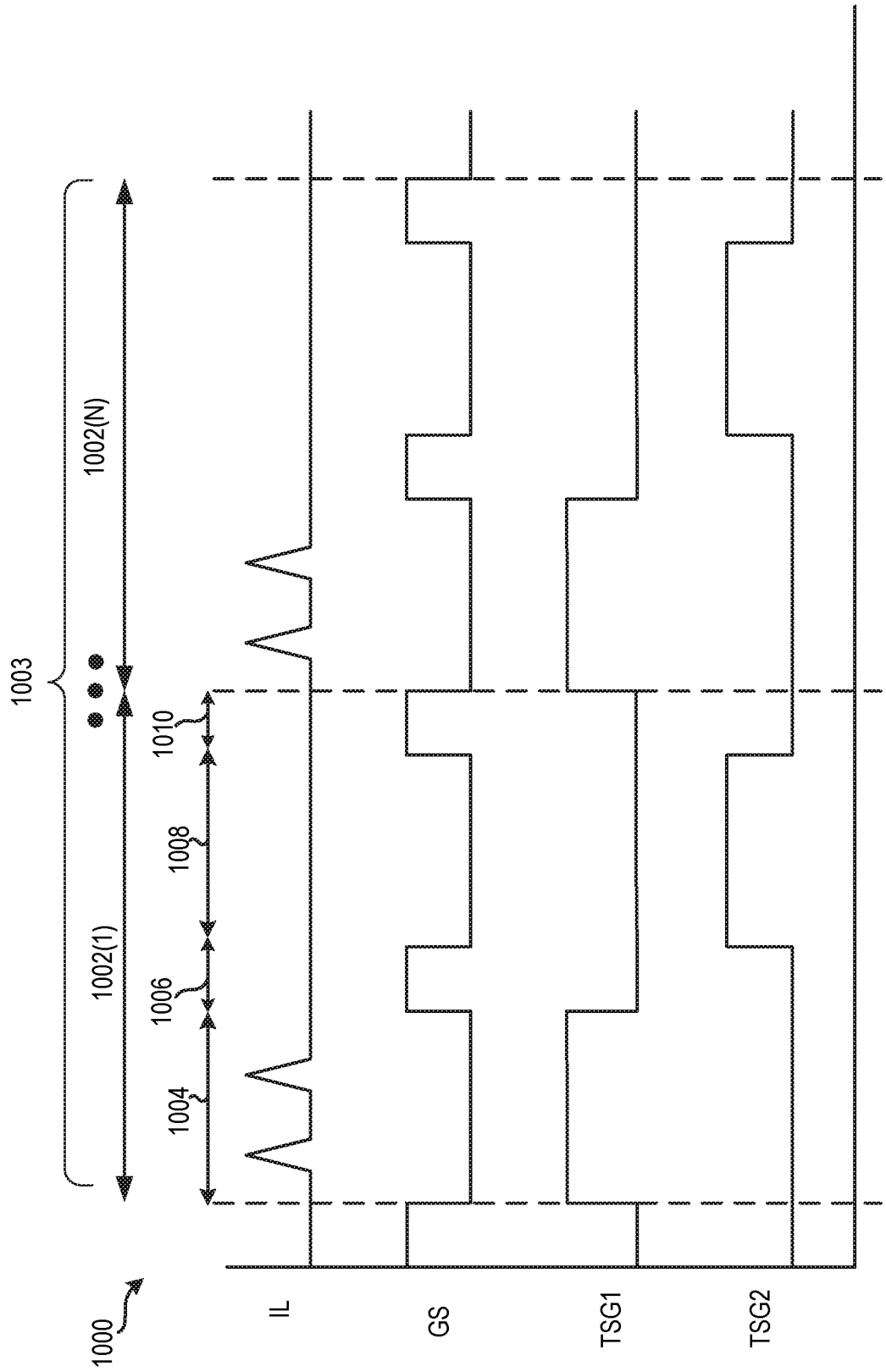
FIG. 10 depicts an exemplary timing diagram showing each of global operating signals (GS, TSG1, TSG2) and illumination signal IL, in another embodiment.

FIG. 10 depicts an exemplary timing diagram 1000 showing each of global operating signals 532 (GS, TSG1, TSG2) and illumination signal IL, in another embodiment. FIG. 10 is similar to FIG. 6. The difference of FIG. 10 from FIG. 6 is described in the following.

A frame 1003 has a plurality of exposure cycles 1002(1)-1002(N). Each exposure cycle 1002(n) (n is 1, 2, 3, . . . N) includes a first time period 1004. First time period 1004 operates as a first transfer-storage gate storage time period that that stores image information in first transfer-storage gate 512 including light from illuminator 402. During first time period 1004, illuminator signal IL may be configured high such that illuminator (i.e. illuminator 402) illuminates the field of view of the photo array (i.e. photo array 406). Furthermore, illuminator signal IL may be toggled on and off, as shown, such that the field of view is illuminated multiple times by illuminator 402 during first time period 1004. This may increase the sensitivity of the camera 400. Although shown with only two illumination signal toggles, it should be appreciated that the illuminator can be activated any number of times during first time period 1004.

Also during first time period 1004, global shutter signal GS is set low such that photodiode 502 may accumulate charge. Accordingly, photodiode 502 accumulates charge representing image data of the field of view including light emitted by illuminator 402 that is reflected off of objects within the field of view of the photo array. Also during first time period 1004, TSG1 is configured high such that accumulated charge within photodiode 502 is stored within first transfer-storage gate 512. Also, TSG2 is set low to configure second transfer-storage gate 512 such that it does not store charge from photodiode 502. The duration of first time period 1004 is configured to capture each of the toggling illuminator signals IL. This will reduce the power consumption as compared with multiple shutter operations, where each shutter operation covers an illuminator signal toggle.

For example, in timing diagram 1000, the ratio of durations of first time period 1004, second time period 1006, third time period 1008 and fourth time period 1010 is: first time period 1004=third time period 1008>second time period 1006=fourth time period 1010. It should be appreciated, however, that the ratio of durations of each time period may be different, and is not limited to the duration ratio shown in FIG. 10.

Figure 11:
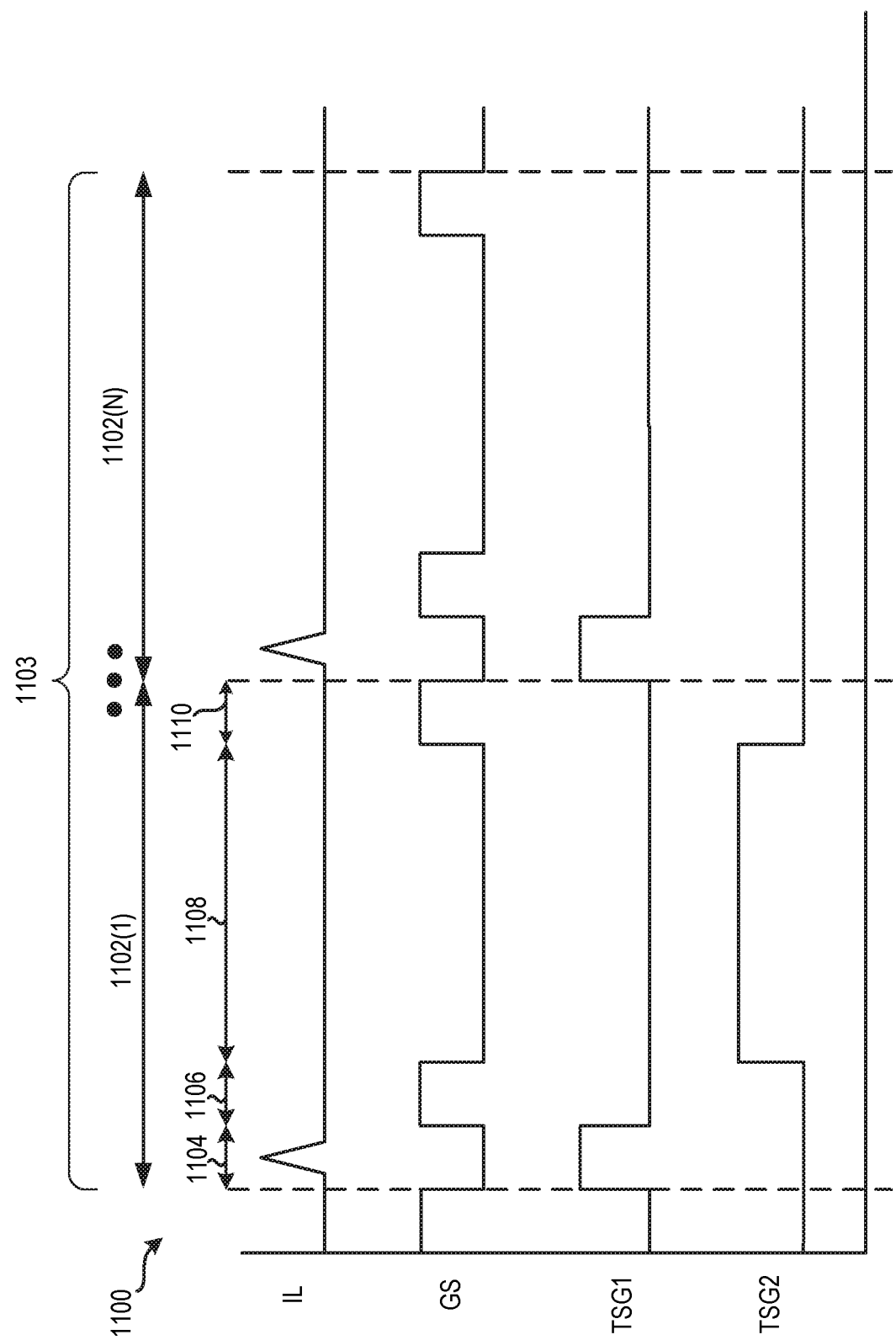
FIG. 11 depicts an exemplary timing diagram showing each of global operating signals (GS, TSG1, TSG2) and illumination signal IL, in another embodiment.

FIG. 11 depicts an exemplary timing diagram 1100 showing each of global operating signals 532 (GS, TSG1, TSG2) and illumination signal IL, in another embodiment. FIG. 11 is similar to FIG. 6. The difference of FIG. 11 from FIG. 6 is described in the following.

A frame 1103 has a plurality of exposure cycles 1102(1)-1102(N). A first exposure cycle 1102(1) is the same as the first exposure cycle 602(1) that includes a period 1108 setting TSG2 high to configure second transfer-storage gate 514 such that it stores charge from photodiode 502. Exposure cycles 1102(2)-1102(N) do not include period 1108 setting TSG2 high to configure second transfer-storage gate 514 such that it stores charge from photodiode 502. This is because for a relative static background, it is not necessary to capture the background (image scene without illumination by illuminator) every time the field of view illuminated by the illuminator is captured. Thus, a high TSG2 signal may follow after a number of high TSG1 signals. This will save the power consumption.

In some occasion, the exposures of the field of view illuminated by the illuminator and the background may not be proportional, because the captured background may be also used as a picture independent of the capturing of the field of view illuminated by the illuminator and its exposure is individually optimized. In this case, the read outs from first transfer-storage gate 512 and second transfer-storage gate 514 may be scaled before the subtraction.

Figure 12:
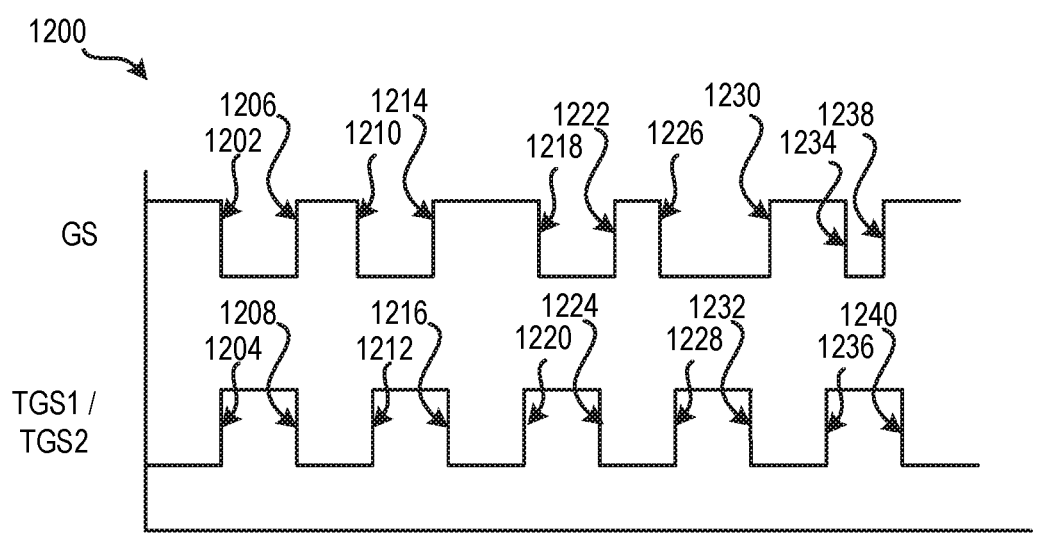
FIG. 12 depicts exemplary timing diagram showing configurations between the rising and falling edges of the GS and TSG1/TSG2 signals, in certain embodiments.

FIG. 12 depicts exemplary timing diagram 1200 showing configurations between the rising and falling edges of the GS and TSG1/TSG2 signals, in certain embodiments. It should be appreciated that the global shutter signal GS need not be precisely synchronized with the TSG1 or TSG2 signal. In timing diagram 1200, falling edge 1202 of global shutter signal GS is synchronized with rising edge 1204 of either TSG1 or TSG2. Furthermore, rising edge 1206 of global shutter signal GS is synchronized with falling edge 1208 of TSG1 or TSG2.

In certain embodiments, the rising/falling edge of global shutter signal GS may be before the rising/falling edge of TSG1 or TSG2. This is shown in timing diagram 1200 where falling edge 1210 of global shutter signal GS is before rising edge 1212 of either TSG1 or TSG2. Furthermore, rising edge 1214 of global shutter signal GS is before falling edge 1216 of TSG1 or TSG2.

In certain embodiments, the rising/falling edge of global shutter signal GS may be after the rising/falling edge of TSG1 or TSG2. This is shown in timing diagram 1200 where falling edge 1218 of global shutter signal GS is after rising edge 1220 of either TSG1 or TSG2. Furthermore, rising edge 1222 of global shutter signal GS is after falling edge 1224 of TSG1 or TSG2.

In certain embodiments, the falling edge of global shutter signal GS may be before the rising edge of TSG1 or TSG2, and the rising edge of global shutter signal GS may be after the falling edge of TSG1 or TSG2. This is shown in timing diagram 1200 where falling edge 1226 of global shutter signal GS is before rising edge 1228 of either TSG1 or TSG2. Furthermore, rising edge 1230 of global shutter signal GS is after falling edge 1232 of TSG1 or TSG2.

In certain embodiments, the falling edge of global shutter signal GS may be after the rising edge of TSG1 or TSG2, and the rising edge of global shutter signal GS may be before the falling edge of TSG1 or TSG2. This is shown in timing diagram 1200 where falling edge 1234 of global shutter signal GS is after rising edge 1236 of either TSG1 or TSG2. Furthermore, rising edge 1238 of global shutter signal GS is before falling edge 1240 of TSG1 or TSG2.

Figure 13:
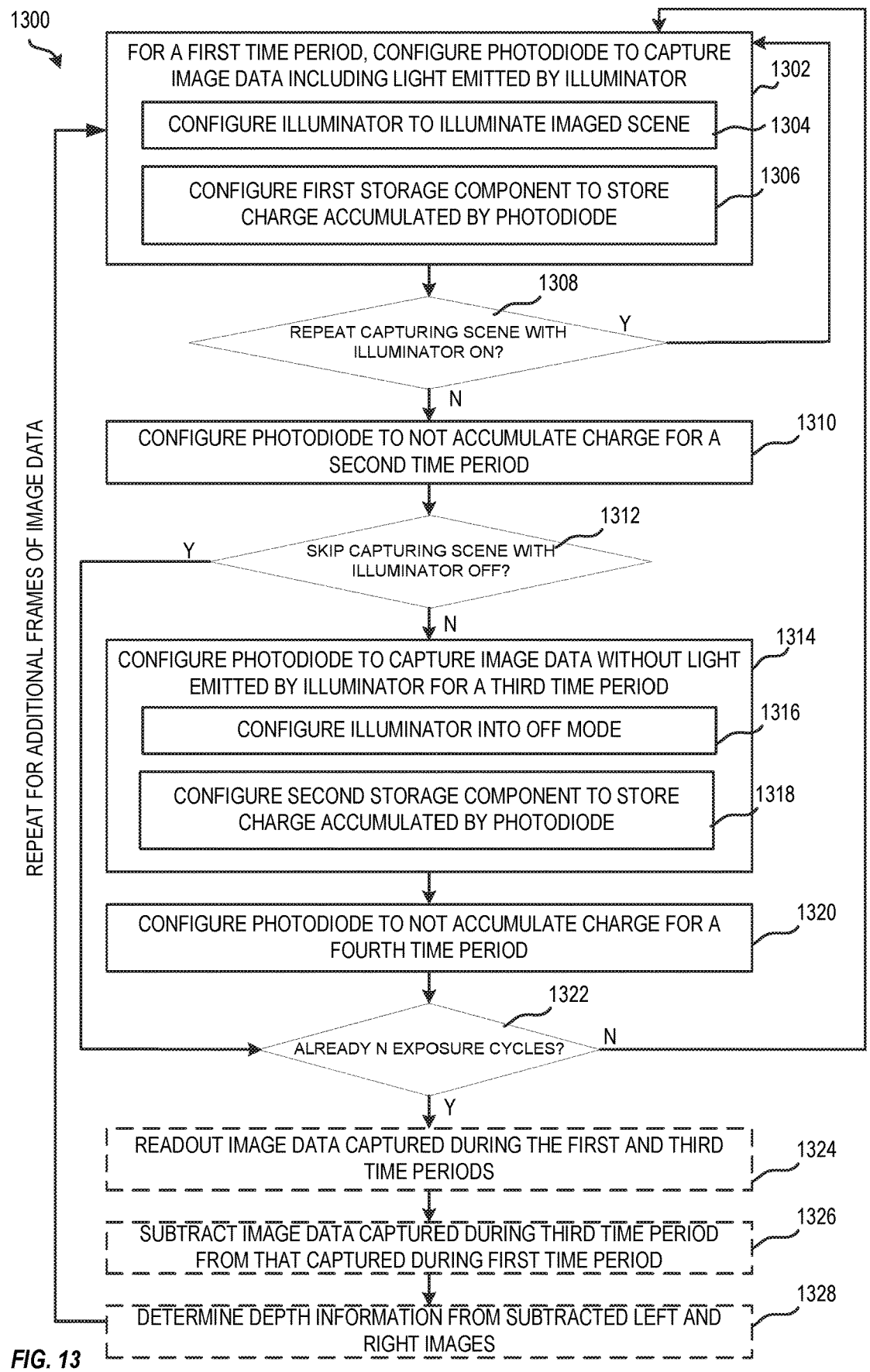
FIG. 13 depicts an exemplary method for operating an active depth pixel camera, in one embodiment.

FIG. 13 depicts an exemplary method 1300 for operating an active depth pixel camera, in one embodiment. For example, method 1300 may be implemented within active depth camera 400, of FIG. 4, including a lock-in dual storage pixel having a global shutter.

In step 1302, method 1300 configures, for a first time period, a photodiode to capture image data including light emitted by an illuminator. In an example of step 1302, circuitry 500, of active depth camera 400 is configured according to one or more of first time periods 604, 704, 804, 904, 1004, 1104 of FIGS. 6-11.

Step 1302 may include a sub-step 1304 of configuring an illuminator to illuminate the imaged scene. In one example of sub-step 1304, circuitry 530 generates illuminator signal IL such that illuminator 402 illuminates the scene within the field of view of pixel array 406. Signal IL may be generated according to any one of timing diagrams 600, 700, 800, 900, 1000, 1100 of FIGS. 6-11 described above.

Step 1302 may include a sub-step 1306 of configuring a first storage component to store charge accumulated by the photodiode. In one example of sub-step 1306, circuitry 530 generates signal TSG1 such that first transfer-storage gate 412 stores charge accumulated by photodiode 502 representative of the field of view including the reflected light emitted by illuminator 402. TSG1 during first time period may be generated according to any one of timing diagrams 600, 700, 800, 900, 1000, 1100 of FIGS. 6-11 described above.

In decision step 1308, method 1300 determines whether the process is set to repeat capturing the scene with illuminator-on. If the process is set to repeat capturing the scene with illuminator-on, the process returns to step 1302 in accordance with timing diagram 1000 of FIG. 10, otherwise the process continues to step 1310.

In step 1310, method 1300 configures, for a second time period, the photodiode such that it does not accumulate a charge. In one example of step 1310, photodiode 502 of active depth camera 400 is configured based upon global shutter signal GS, generated by circuitry 530, such that photodiode 502 does not generate a charge. Second time period may be configured according to any of the second time periods 606, 706, 806, 906, 1006, 1106 as discussed above with regards to FIGS. 6-11.

In step 1312, method 1300 configures whether the process is set to skip capturing the scene with illuminator-off. If the process is set to skip capturing the scene with illuminator-off, the process is directed to step 1322 bypassing step 1314 in accordance with timing diagram 1100 of FIG. 10, otherwise the process continues to step 1314.

In step 1314, method 1300 configures, for a third time period, the same photodiode of step 1302 to capture image data that does not include light emitted by an illuminator. In an example of step 1314, circuitry 500, of active depth camera 300 is configured according to one or more of third time periods 608, 708, 808, 908, 1008, 1108 of FIGS. 6-10 as discussed above.

Step 1314 may include a sub-step 1316 of configuring an illuminator in an off mode. In one example of sub-step 1316, circuitry 530 generates illuminator signal IL such that illuminator 402 does not illuminate the scene within the field of view of photo array 406. Signal IL may be generated according to any one of timing diagrams 600, 700, 800, 900, 1000, 1100 of FIGS. 6-11 described above.

Step 1314 may include a sub-step 1318 of configuring a second storage component to store charge accumulated by the photodiode. In one example of sub-step 1314, circuitry 530 generates signal TSG2 such that second transfer-storage gate 514 stores charge accumulated by photodiode 502 representative of the field of view without the reflected light emitted by illuminator 402 (background). TSG2 during third time period may be generated according to any one of timing diagrams 600, 700, 800, 900, 1000, 1100 of FIGS. 6-11 described above.

In step 1320, method 1300 configures, for a fourth time period, the photodiode such that it does not accumulate a charge. In one example of step 1320, photodiode 502 of active depth camera 400 is configured based upon global shutter signal GS, generated by circuitry 530, such that photodiode 502 does not generate a charge. Fourth time period may be configured according to any of the fourth time periods 610, 710, 810, 910, 1010, 1110 as discussed above with regards to FIGS. 6-11. Altering the duration of the fourth time period may change the sensitivity of the system and method.

The ratios of the first, second, third, and fourth time period may be generated according to any ratio of the time periods described above with respect to FIGS. 6-10.

In step 1322 method 1300 configures whether the process has already repeated N exposure cycles. If the process has repeated N exposure cycle, the process continues to step 1324, otherwise the process returns to step 1302. Note N may be any integer.

In optional step 1324, method 1300 reads out the image data captured during the first and third time periods. In example of operation of step 1324, circuitry 530 generates row specific signals 534 to readout the image data stored within the first and second storage components 504, 506, respectively.

In optional step 1326, method 1300 subtracts the image data captured during the third time period (background) from the image data captured during the first time period (the field of view including the reflected light emitted by the illuminator). Method 1300 may scale the image data captured during the first and third time periods before the subtraction if it is necessary. Step 1324 may be performed by subtracting the image data from the second storage component 506 from that of the first storage component 504.

Method 1300 includes steps 1302-1326 for left and right images. For example, method 1300 is performed for each imager 104A, 104B. In optional step 1328, method 1300 determines depth information from the subtracted left and right images obtained from steps 1302-1326.

After step 1328, the process returns to step 1302. The process is repeated for additional frames of image data. This system and method increases the signal to noise ratio of the illuminated light signal. It also increases range of the active depth camera. This system and method allows such improvements without requiring increased laser power such that the laser power is still within safe operating ranges without hurting the human eyes.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. An active depth imaging system with background subtract comprising:
   an illuminator for emitting a light ray projecting a bright spot to an object in a scene, the object reflecting the emitted light ray;
   a first imager for imaging a first image set of the scene and a second imager for imaging a second image set of the scene, the first and second image sets each including an illuminator-on image data representing the scene when the illuminator is in an on mode, and an illuminator-off image data representing the scene when the illuminator is in an off mode;
   an image processor programmed to:
     generate a first and a second background-subtracted image data by, for each of the first and second image sets, subtracting the illuminator-off image data from the illuminator-on image data, and
     analyze the first and the second background-subtracted image data using triangulation based on a common feature in the first and the second background-subtracted images to determine a depth of the object reflecting the emitted light ray in the scene, the common feature being the projected bright spot.

2. The active depth imaging system of claim 1, wherein the first and second imagers comprising an image array including:
   a plurality of pixels, each pixel including:
     a photodiode coupled with a first storage component and a second storage component, and
     a global shutter switch for controlling charge accumulation within the photodiode,
   signal generation circuitry for generating a plurality of signals to control each pixel for a first, second, third, and fourth time periods such that:
     during the first time period, the photodiode captures the illuminator-on image data, and storing the illuminator-on image data in the first storage component,
     during the second and fourth time periods, the photodiode does not accumulate any charge,
     during the third time period, the photodiode captures the illuminator-off image data, and storing the illuminator-off image data in the second storage component.

3. The active depth imaging system of claim 2, each of the first and second imagers further comprising:
   readout circuitry for obtaining the illuminator-on and illuminator-off image data from the first and second storage components;
   the first storage component including:
     a first transfer-storage gate for transferring and storing the illuminator-on image data from the photodiode, and a first output gate for outputting the illuminator-on image data to the readout circuitry; and
   the second storage component including:
     a second transfer-storage gate for transferring and storing the illuminator-off image data from the photodiode, and a second output gate for outputting the illuminator-off image data to the readout circuitry.

4. The active depth imaging system of claim 3, the first transfer-storage gate adapted to store multiple exposures of illuminator-on image data before the first output gate outputs the stored multiple exposures of illuminator-on image data.

5. The active depth imaging system of claim 4, the second transfer-storage gate adapted to store multiple exposures of illuminator-off image data before the second output gate outputs the stored multiple exposures of illuminator-off image data.

6. The active depth imaging system of claim 3, the plurality of signals including a global shutter signal (GS) for controlling the global shutter, a first transfer-storage signal (TSG1) for controlling the first transfer-storage gate, and a second transfer-storage signal (TSG2) for controlling the second transfer-storage gate.

7. The active depth imaging system of claim 6, a falling edge of the GS being synchronized with a rising edge of at least one of the TSG1 and TSG2, and a rising edge of the GS being synchronized with a falling edge of at least one of the TSG1 and TSG2.

8. The active depth imaging system of claim 6, a falling edge of the GS being before a rising edge of at least one of the TSG1 and TSG2, and a rising edge of the GS being before a falling edge of at least one of the TSG1 and TSG2.

9. The active depth imaging system of claim 6, a falling edge of the GS being after a rising edge of at least one of the TSG1 and TSG2, and a rising edge of the GS being after a falling edge of at least one of the TSG1 and TSG2.

10. The active depth imaging system of claim 6, a falling edge of the GS being before a rising edge of at least one of the TSG1 and TSG2, and a rising edge of the GS being after a falling edge of at least one of the TSG1 and TSG2.

11. The active depth imaging system of claim 1, the illuminator-on image data including data of multiple exposures of the illuminator.

12. A method for operating an active depth imaging system comprising:

capturing a left image and a right image, each captured image captured via a plurality of exposure cycles, each exposure cycle comprising:
for a first time period, configuring each of a first and second imager of the active depth imaging system to capture illuminator-on image data representing an imaged scene and a projected bright spot in the imaged scene from light emitted by an illuminator;
for a second time period, configuring each of the first and second imager to not accumulate a charge;
for a third time period, configuring each of the first and second imager to capture illuminator-off image data representing the imaged scene without the light;
for a fourth time period, configuring each of the first and second imager to not accumulate a charge;
accumulating, for each of the respective first and second imagers, the illuminator-on image data captured in the plurality of exposure cycles and accumulating, for each of the respective first and second imagers, the illuminator-off image data capture in the plurality of exposure cycles;
subtracting, for each of the respective first and second imagers, the accumulated illuminator-off image data from the accumulated illuminator-on image data to identify the light emitted by the illuminator within the scene; and,
identifying, via triangulation based on a common feature in the left and the right subtracted images, depth information of an object within the imaged scene at which the light is incident on, the common feature being the projected bright spot.

13. The method of claim 12, further comprising during the first time period, configuring the illuminator to illuminate the imaged scene more than once.

14. The method of claim 12, further comprising during the first time period, storing the illuminator-on image data captured respectively by each of the first and second imagers in a first storage component of the each respective first and second imagers.

15. The method of claim 12, further comprising reading out the illuminator-on and illuminator-off image data after the plurality of exposure cycles.

16. The method of claim 12, further comprising, during the first time period, toggling the illuminator.

17. The method of claim 12, a duration of each of the first, second, third, and fourth time periods being equal.

18. The method of claim 12, a duration of the first time period being greater than a duration of each of the second, third, and fourth time periods, and a duration of the second time period being less than a duration of the third and fourth time periods.

19. The method of claim 12, a duration of the third time period being greater than a duration of each of the first, second, and fourth time periods, and a duration of the fourth time period being less than a duration of the first and second time periods.

20. The method of claim 12, a duration of each of the first and third time periods being equal to each other and greater than a duration of each of the second and fourth time periods.

21. The method of claim 12, the duration of the second and fourth time periods being equal to each other.

22. The active depth imaging system of claim 1, the illuminator being outside of the scene.

* * * * *